US007728688B2

(12) United States Patent
Shor

(10) Patent No.: US 7,728,688 B2
(45) Date of Patent: Jun. 1, 2010

(54) POWER SUPPLY CIRCUIT FOR A PHASE-LOCKED LOOP

(75) Inventor: Joseph Shor, Tel Mond (IL)

(73) Assignee: Intel Corporation, Santa Clara, CA (US)

( * ) Notice: Subject to any disclaimer, the term of this patent is extended or adjusted under 35 U.S.C. 154(b) by 347 days.

(21) Appl. No.: 11/634,993

(22) Filed: Dec. 7, 2006

(65) Prior Publication Data
US 2008/0136472 A1 Jun. 12, 2008

(51) Int. Cl.
*H03L 7/099* (2006.01)

(52) U.S. Cl. .......................... 331/185; 331/16; 331/57; 331/175; 331/176; 331/182; 331/183; 331/184; 327/156; 327/157; 327/158; 327/159; 327/185; 327/186; 327/540; 365/226; 330/228

(58) Field of Classification Search .................... 331/16, 331/57, 175, 176, 182–185; 327/156–159, 327/185, 186, 540; 365/226; 330/228
See application file for complete search history.

(56) References Cited

U.S. PATENT DOCUMENTS

| 5,483,180 | A | * | 1/1996 | Chai et al. ..................... 326/93 |
| 5,801,523 | A | * | 9/1998 | Bynum ........................ 323/315 |
| 5,880,579 | A | * | 3/1999 | Wei et al. ..................... 323/282 |
| 6,621,675 | B2 | * | 9/2003 | Ingino, Jr. ................... 361/91.1 |
| 2003/0020526 | A1 | * | 1/2003 | Ingino, Jr. ................... 327/157 |
| 2005/0077936 | A1 | * | 4/2005 | Cranford et al. ............. 327/156 |
| 2005/0083762 | A1 | * | 4/2005 | Ikai et al. ..................... 365/226 |
| 2007/0210775 | A1 | * | 9/2007 | Bothra et al. ................ 323/283 |
| 2008/0068056 | A1 | * | 3/2008 | Poulton et al. .............. 327/156 |
| 2008/0111646 | A1 | * | 5/2008 | Nair ............................ 331/185 |

OTHER PUBLICATIONS

U.S. Appl. No. 11/210,050, filed Aug. 22, 2005, Joseph Shor et al.

* cited by examiner

*Primary Examiner*—Arnold Kinkead
*Assistant Examiner*—Richard Tan
(74) *Attorney, Agent, or Firm*—Ked & Associates, LLP

(57) ABSTRACT

A power supply circuit includes a first voltage regulator to generate a first supply voltage for a first circuit of a phase-locked loop and a second voltage regulator to generate a second supply voltage for a second circuit of the phase-locked loop. The first and second supply voltages are independently generated by the first and second voltage regulators based on the same reference signal. The first circuit may be a charge pump and the second circuit may be a voltage-controlled oscillator. Different circuits may be supplied with the independently generated supply voltages in alternative embodiments.

20 Claims, 10 Drawing Sheets

POWER SUPPLY CIRCUIT FOR A PHASE-LOCKED LOOP

FIELD

The present invention relates in at least some of its embodiments to generating signals for various circuit applications.

BACKGROUND

Phase-locked loop (PLL) circuits are in wide use in many communication and computer-based applications. While these devices have generally proved to be reliable, they do experience inaccuracies which tend to adversely affect the performance of their host circuits. These inaccuracies are attributable, in part, to noise and specifically jitter that is introduced into the PLL from power supply voltages.

DETAILED DESCRIPTION

Figure 1:
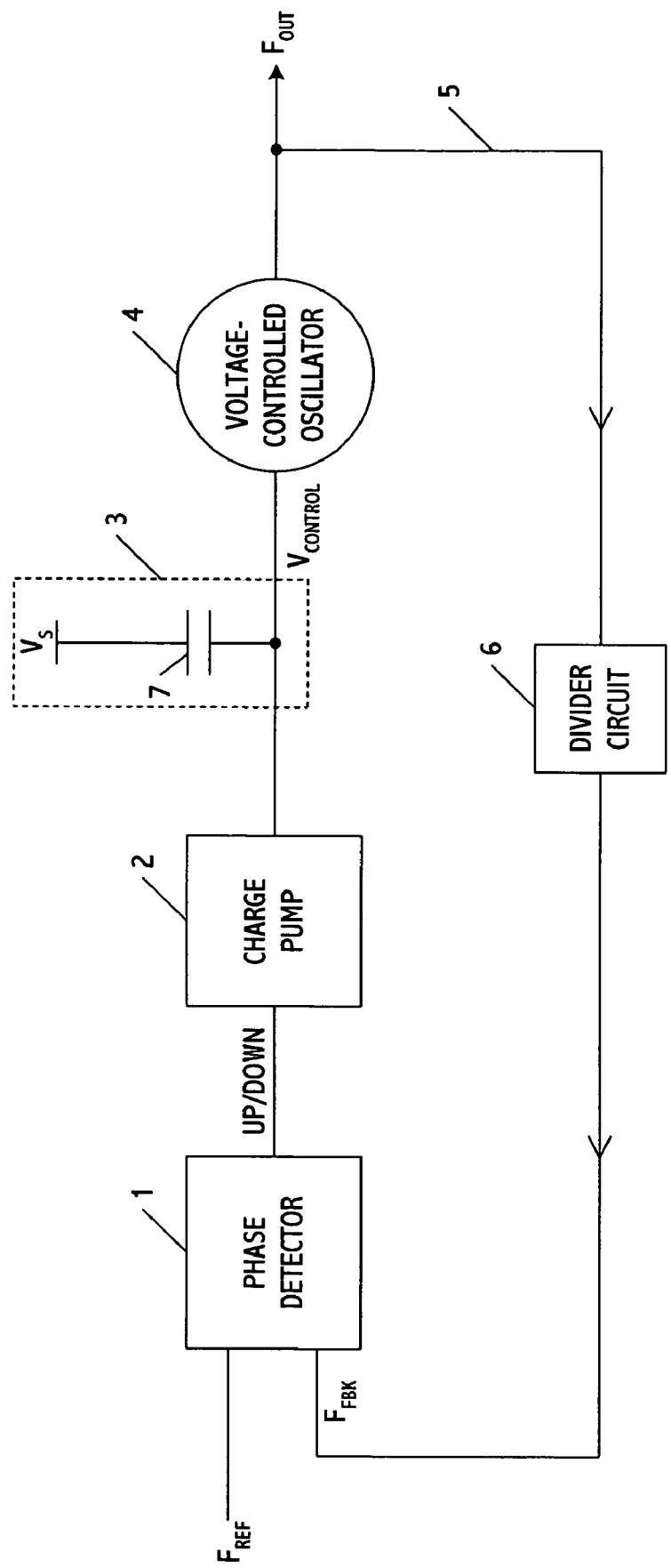
FIG. 1 is a diagram showing an example of a phase-locked loop.

FIG. 1 shows a phase-locked loop circuit formed from a phase-frequency detector 1, a charge pump 2, a loop filter 3, and a voltage-controlled oscillator (VCO) 4 that generates an output frequency, $F_{out}$. The output of oscillator 4 is coupled to an input of the phase-frequency detector along a feedback path 5. The feedback path may optionally include a divider circuit 6 for dividing frequency $F_{out}$ before it is input into the phase-frequency detection.

In operation, the phase-frequency detector compares a reference frequency, $F_{ref}$, with a feedback signal, $F_{fbk}$, and outputs an up signal or down signal based on the comparison. If the reference frequency leads the feedback frequency, the up signal may be applied to the charge pump. Conversely, if the reference frequency lags the feedback frequency, the down signal may be applied. Of course, those skilled in the art can appreciate that the signals may be reversed depending upon whether the voltage-controlled oscillator has positive or negative gain.

The charge pump sources current to or sinks current from the loop filter based on the signal output from the phase-frequency detector. The amount of current to be sourced or sinked depends on the width of the up or down signal (whichever is applied), i.e., the width of the up or down signal is proportional to the phase difference between the reference and feedback frequencies. Accordingly, this width determines how much source/sink current is applied to the loop filter.

The loop filter performs at least two functions. First, the loop filter functions as a low-pass filter for suppressing high-frequency noise. This filtering function may therefore provide stability to the operation of the phase-locked loop circuit. Second, the loop filter capacitor 7 may perform the function of integrating the current signal output from the charge pump to produce a smooth control voltage, $V_{control}$, for oscillator 4. The voltage-controlled oscillator then generates frequency $F_{out}$ based on this control voltage.

All of the circuits in the PLL are very sensitive to changes in their supply voltage. This is especially true of the VCO, which is the most sensitive circuit. Variations in the supply voltage may lead to jitter in the PLL. It is thus desired to have supply voltages for the PLL which exhibit a high power supply rejection ratio (PSRR).

Figure 2:
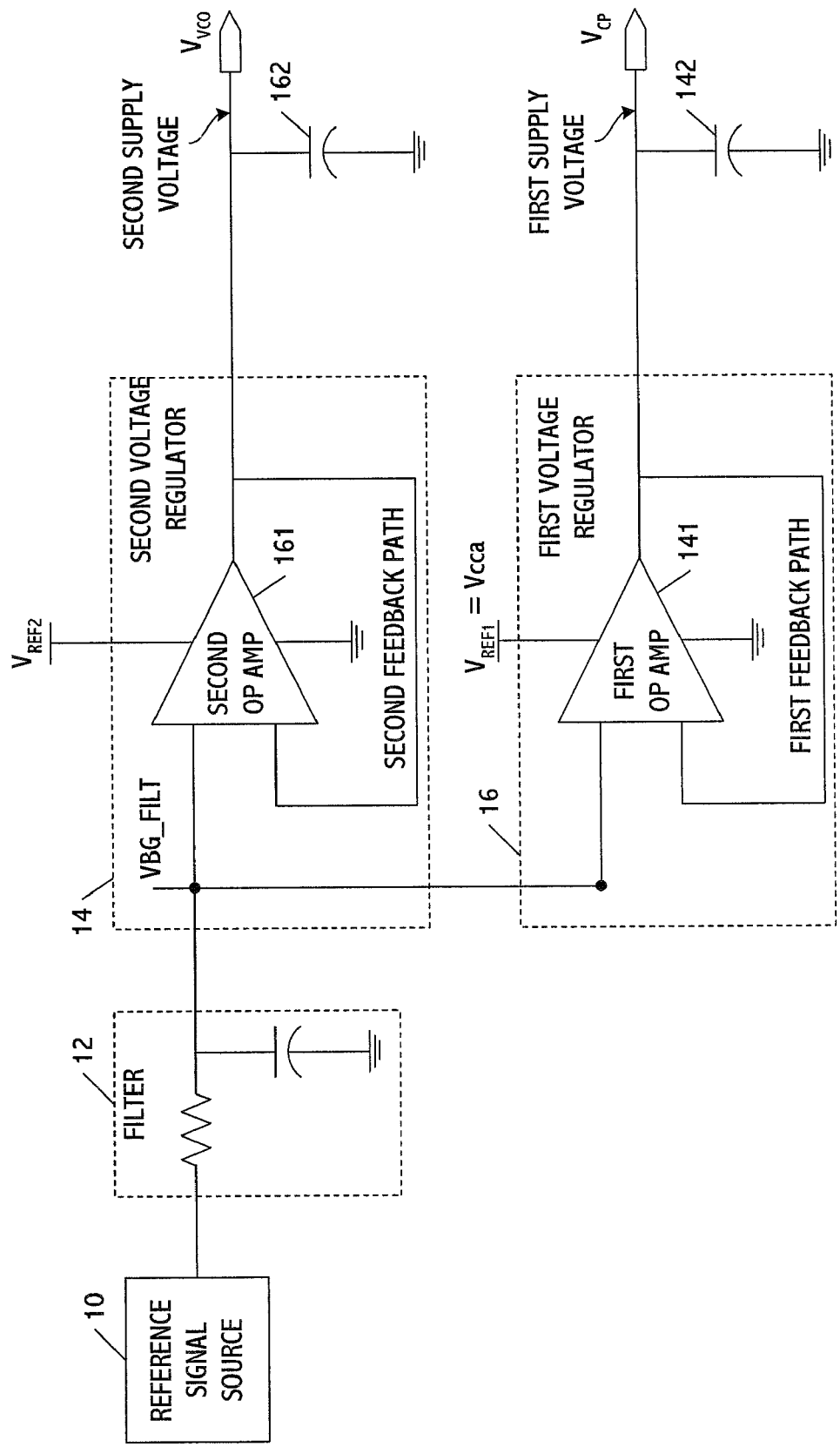
FIG. 2 is a diagram showing a power supply circuit in accordance with a first embodiment of the present invention.

FIG. 2 shows a power supply circuit in accordance with a first embodiment of the present invention. The power supply circuit operates to independently generate supply voltages for at least first and second circuits in a phase-locked loop. The phase-locked loop may be any type of PLL including but not limited to the one shown in FIG. 1. Other types of PLLs may include, for example, ones that have self-biasing circuits, frequency signal dividers, and modulus or programmable counter or controller circuits coupled to a divider along the feedback path as well as other types of phase-locked loops or variations of the ones described herein.

The power supply circuit includes a reference signal source 10, a filter 12, and first and second voltage regulators 14 and 16 for generating independent supply voltages based on the output of the filter. The reference signal source may generate, for example, a bandgap reference signal (BGREF) suitable for an intended application of the phase-locked loop. According to one application, source 10 may generate a bandgap reference signal with a 40 dB power supply rejection ratio (PSRR) value in one frequency range and a bandgap reference signal with a 50 dB PSRR value in a second frequency range, which may be lower than the first frequency range. In alternative embodiments, source 10 may generate reference signals with different PSRR values. A different type of reference signal (e.g., one other than a bandgap reference signal) may be used for other applications.

Filter 12 may operate as a low-pass filter which enables a predetermined PSRR to be achieved at frequencies above the bandwidth of reference voltage source 10. The filter may be formed, for example, from an RC circuit. While a low-pass filter of this type may be suitable for some applications, different filters, for example, with different passbands and/or different PSRR requirements may be used in alternative embodiments.

Voltage regulators 14 and 16 independently generate supply voltages based on the reference signal ($V_{BG\_FILT}$) output from filter 12. In accordance with one embodiment, the first voltage regulator generates a first supply voltage ($V_{cp}$) which may serve as the supply voltage for the charge pump of the phase-locked loop. The second voltage regulator generates a second supply voltage ($V_{vco}$) which may serve as a supply voltage for the voltage-controlled oscillator in the phase-locked loop. The two supply voltages may be different voltages or both supply voltages may be the same voltage. In alternative embodiments, the first and second voltage regulators may generate supply voltages to different elements of the phase-locked loop, e.g., the loop filter, the phase-frequency detector, biasing circuits, and/or various dividers or divider controller in or coupled to the PLL.

The first voltage regulator includes an operational amplifier 141 having one input coupled to receive the reference signal from filter 12 and another input coupled to receive first supply voltage $V_{cp}$ through a feedback path. The amplifier may also have differential control terminals including a first control terminal coupled to a first external supply voltage ($V_{ref1}$) and a second control terminal coupled to a second voltage, e.g., ground.

In operation, amplifier 141 generates first supply voltage $V_{cp}$ based on a difference between its input voltages and a predetermined gain of the amplifier, which is selected along with reference signal $V_{BG\_FILT}$ to ensure that the first supply voltage $V_{cp}$ corresponds to a predetermined value. An optional capacitor 142 may be coupled to the output of amplifier 141 to perform an integration function for stability purposes.

The second voltage regulator includes an operational amplifier 161 having one input coupled to receive the reference signal from filter 12 and another input coupled to receive second supply voltage $V_{vco}$ through a feedback path. Amplifier 161 may also be coupled to receive $V_{ref2}$ as its positive external supply voltage, which may be the same or different from $V_{ref1}$ supplied to amplifier 141.

In operation, amplifier 161 generates second supply voltage $V_{vco}$ based on a difference between its input voltages and a predetermined gain of the amplifier, which is selected along with $V_{BG\_FILT}$ to ensure that the second supply voltage $V_{vco}$ corresponds to a predetermined value. An optional capacitor 162 may be coupled to the output of amplifier 161 to perform an integration function for stability purposes.

According to one application, the power supply circuit of FIG. 2 may be applied to reduce jitter in the phase-locked loop as a result of independently generating supply voltages for the charge pump and VCO. This may be understood by way of comparison to other types of phase-locked loops where, for example, the charge pump and VCO are coupled to the same power supply circuit. In PLLs of this type, voltage drops in the supply voltage (e.g., 5-10 mV) caused by operation of the charge pump translate into drops in the supply voltage to the VCO. These drops introduce jitter, and thus noise, into the PLL, thereby substantially degrading performance.

In contrast, the power supply circuit of FIG. 2 independently generates the supply voltages for the charge pump and VCO. Drops in the supply voltage caused by operation of the charge pump therefore will not adversely affect the supply voltage for the VCO. This is because the charge pump is isolated from the circuit that is used to provide the supply voltage to the VCO, i.e., both the VCO and charge pump receive regulated but separate supply voltages. As a result, the amount of jitter, and thus noise, introduced into the phase-locked loop from the power supply circuit is substantially reduced or eliminated, resulting in improved performance.

According to one exemplary application, the power supply circuit of FIG. 2 may independently generate the first supply voltage $V_{cp}$=1.1 V and the second supply voltage $V_{vco}$=1.1 V using external supply voltage of 1.5 V. As a result, the charge pump supply may achieve a 30 dB power supply rejection ratio and the voltage-controlled oscillator may achieve a power supply rejection ratio equal to or greater than 40 dB.

Figure 3:
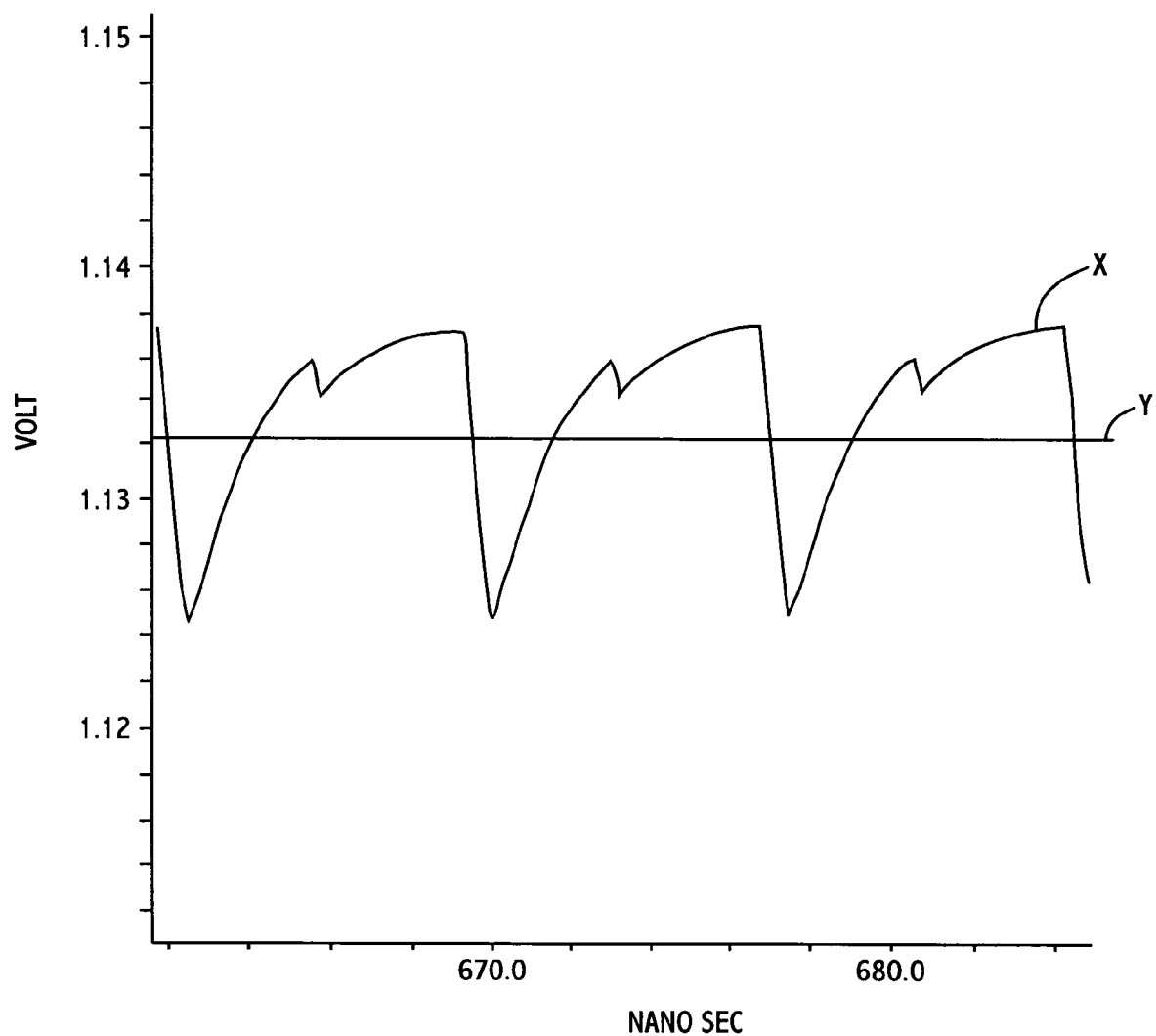
FIG. 3 is a graph showing performance values obtained from a simulation of the power supply circuit of FIG. 2.

FIG. 3 is a graph showing performance values obtained from a simulation of the power supply circuit of FIG. 2. In this example, waveform X corresponds to the charge pump supply voltage ($V_{cp}$) and waveform Y corresponds to the VCO supply voltage ($V_{vco}$) which is a substantially constant value of approximately 1.132V. By comparing the waveforms in FIG. 3, it is clear that a voltage drop occurs in the supply voltage (approximately 0.012 V) in waveform X caused by operation of the charge pump, but that this drop does not occur in the supply voltage in waveform Y for the voltage-controlled oscillator. The graph, therefore, shows that the isolation provided by the independent voltage regulators used to generate supply voltages $V_{cp}$ and $V_{vco}$ prevents the charge pump from adversely affecting the supply voltage for the VCO. This isolation translates into less jitter and noise in the phase-locked loop.

It should be noted that in this example, because the signal paths used to generate the charge-pump and VCO supply voltages receive the same input reference voltage (e.g., from filter 12), they will output virtually the same supply voltage. This is true even taking into account the effect of device mismatch, since the voltage regulator may have a very low random offset (approximately 5 mV sigma).

Figure 4:
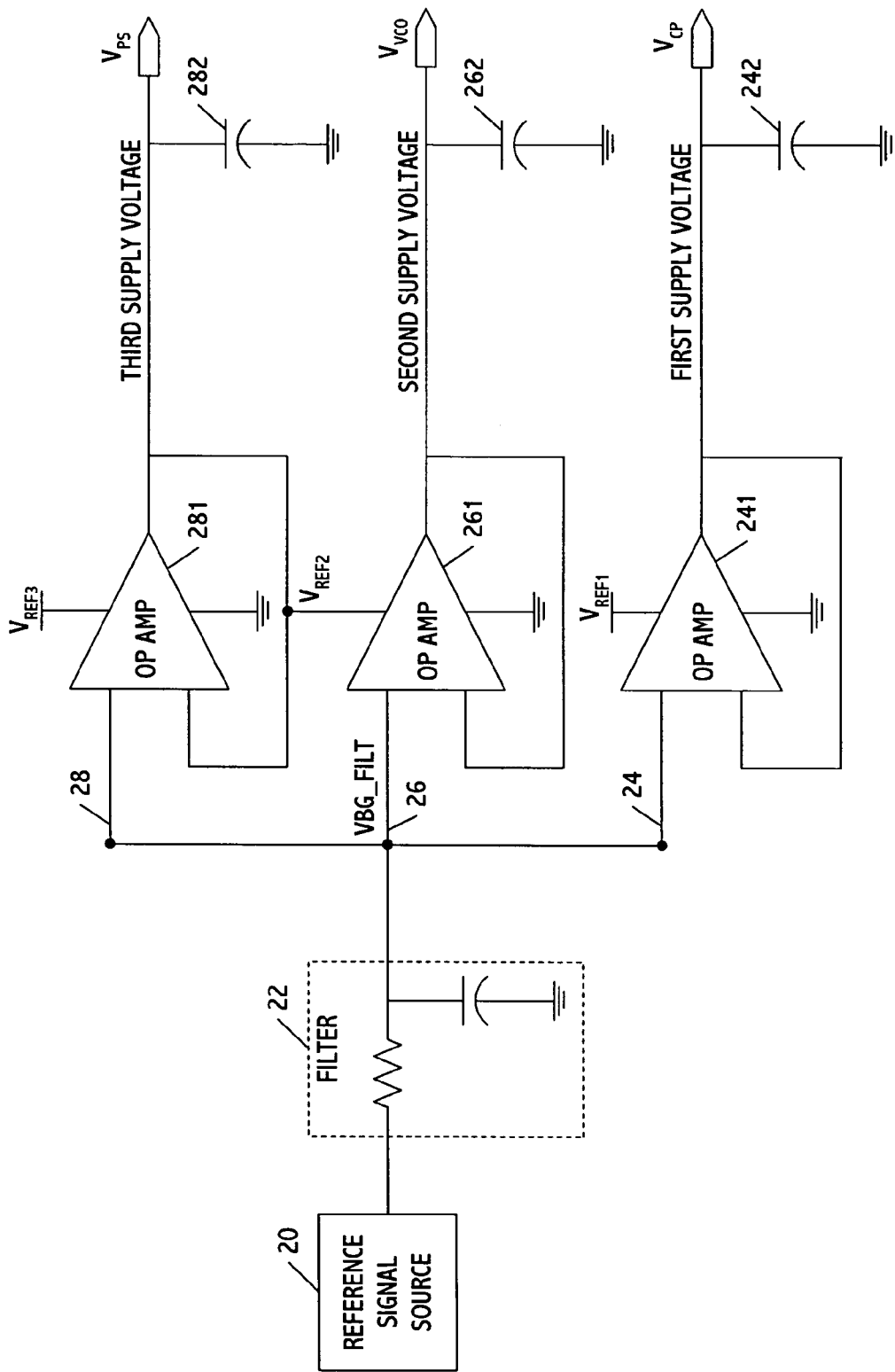
FIG. 4 is a diagram showing a power supply circuit in accordance with a second embodiment of the present invention.

FIG. 4 shows a power supply circuit in accordance with a second embodiment of the present invention. Like the first embodiment, the power supply circuit independently generates supply voltages for different circuits in a phase-locked loop. For consistency purposes, these circuits are described as a charge pump and voltage-controlled oscillator. However, in alternative embodiments, it is understood that different circuits in the PLL may receive the independently generated supply voltages.

The power supply circuit according to the second embodiment includes a reference signal source 20, a filter 22, and three voltage regulators 24, 26, and 28 that independently generate supply voltages based on the output of the filter. The reference signal source and filter may be the same ones described with respect the first embodiment. Also, as in the first embodiment, the filter may be considered to be an optional component of the circuit.

Voltage regulators 24, 26, and 28 independently generate supply voltages based on the reference signal ($V_{BG\_FILT}$) output from filter 22. The first signal path generates a first supply voltage ($V_{cp}$) which may serve as the supply voltage for the charge pump. The second signal path generates a second supply voltage ($V_{vco}$) which may serve as a supply voltage for the voltage-controlled oscillator. And, the third signal path generates a third supply voltage ($V_{ps}$). The three supply voltages may be different voltages or some or even all of the supply voltages may be the same voltage. For example, the charge pump and VCO supply voltages $V_{cp}$ and $V_{vco}$ may be the same voltage or may lie within the same range of voltages, and the third power supply voltage may serve as the power supply for another part of the phase-locked loop and/or for the second signal path.

The first voltage regulator includes an operational amplifier 241 having one input coupled to the reference signal from filter 22 (or optionally source 20) and another input coupled to first supply voltage $V_{cp}$ through a feedback path. The operational amplifier may also be coupled to receive $V_{ref1}$ as its positive external supply voltage. In operation, amplifier 241 generates first supply voltage $V_{cp}$ based on a difference between its input voltages and a predetermined gain of the amplifier, which is selected along with the reference signal (e.g., $V_{BG\_FILT}$) to ensure that the first supply voltage $V_{cp}$ corresponds to a predetermined value. An optional capacitor 242 may be coupled to the output of amplifier 241 to perform an integration function for stability purposes.

The second voltage regulator includes a circuit formed from an operational amplifier 261 having one input coupled to receive the reference signal from filter 22 (or optionally from source 20) and another input coupled to receive second supply voltage $V_{vco}$ through a feedback path. Operational amplifier 261 may be coupled to receive $V_{ref2}$ as its positive external supply voltage. This external supply voltage may be based on or correspond to a voltage generated from a signal path which includes the third voltage regulator.

In operation, amplifier 261 generates second supply voltage $V_{vco}$ based on a difference between its input voltages and a predetermined gain of the amplifier, which is selected along with the reference signal (e.g., $V_{BG\_FILT}$) to ensure that the second supply voltage $V_{vco}$ corresponds to a predetermined value. An optional capacitor 262 may be coupled to the output of amplifier 261 to perform an integration function for stability purposes.

The third voltage regulator includes an operational amplifier 281 having one input coupled to receive the reference signal from filter 22 (or optionally from source 20) and another input coupled to receive second supply voltage $V_{ps}$ through a feedback path. Operational amplifier 281 may also be coupled to receive $V_{ref3}$ as a positive external supply voltage. This supply voltage may be the same as the external supply voltage $V_{ref1}$ coupled to amplifier 141 or these voltages may be different. According to one embodiment, $V_{ref3}=V_{ref3}=VCCA$ which corresponds to an external supply voltage.

In operation, amplifier 281 generates third supply voltage $V_{ps}$ based on a difference between its input voltages and a predetermined gain of the amplifier, which is selected along with the reference signal (e.g., $V_{BG\_FILT}$) to ensure that the third supply voltage $V_{ps}$ corresponds to a predetermined value. The third supply voltage may serve as the positive input supply voltage for amplifier 261 along the supply path, e.g., $V_{ref2}=V_{ps}$. An optional capacitor 282 may be coupled to the output of amplifier 281 to perform an integration function for stability purposes.

It should be noted that the VCO may be more sensitive to supply variations than the charge pump. Hence, it may require a "cleaner" supply voltage. In the configuration of FIG. 4, amplifier 281 regulates the supply of amplifier 261. The VCO supply $V_{vco}$, from a PSRR perspective, has two voltage regulators in series with each other. This allows each of their respective PSRR characteristics to add nearly linearly. Thus, for example, if amplifiers 261 and 281 each have a PSRR characteristic of −20 dB, the total PSRR which $V_{vco}$ sees may be −40 dB. This −40 dB PSRR may correspond to a 100× filtering of the noise from $V_{ref3}$. It should be noted that in practice the benefit of two regulators in series may not add linearly. For example, in order to reach a −45 dB PSRR, two −30 dB voltage regulators arranged in series may have to be used.

Like the power supply circuit of FIG. 2, the power supply circuit of FIG. 4 may reduce jitter in a phase-locked loop circuit through its independently generated supply signals. According to one exemplary application, the power supply circuit of FIG. 4 may independently generate the first supply voltage $V_{cp}=1.1$ V, the second supply voltage $V_{vco}=1.1$ V, and the third supply $V_{ps}=1.25$-1.3 V using an external supply voltage (VCCA) of 1.5 V. Based on these values, the charge pump supply may achieve a PSRR value of 30 dB and the voltage-controlled oscillator may achieve a PSRR value of 45 dB. Also, the power supply circuits according to the aforementioned embodiments may realize low headroom conditions (e.g., <200 mV), and the total headroom required for the VCO supply voltage may therefore be 400 mV.

Figure 5A:
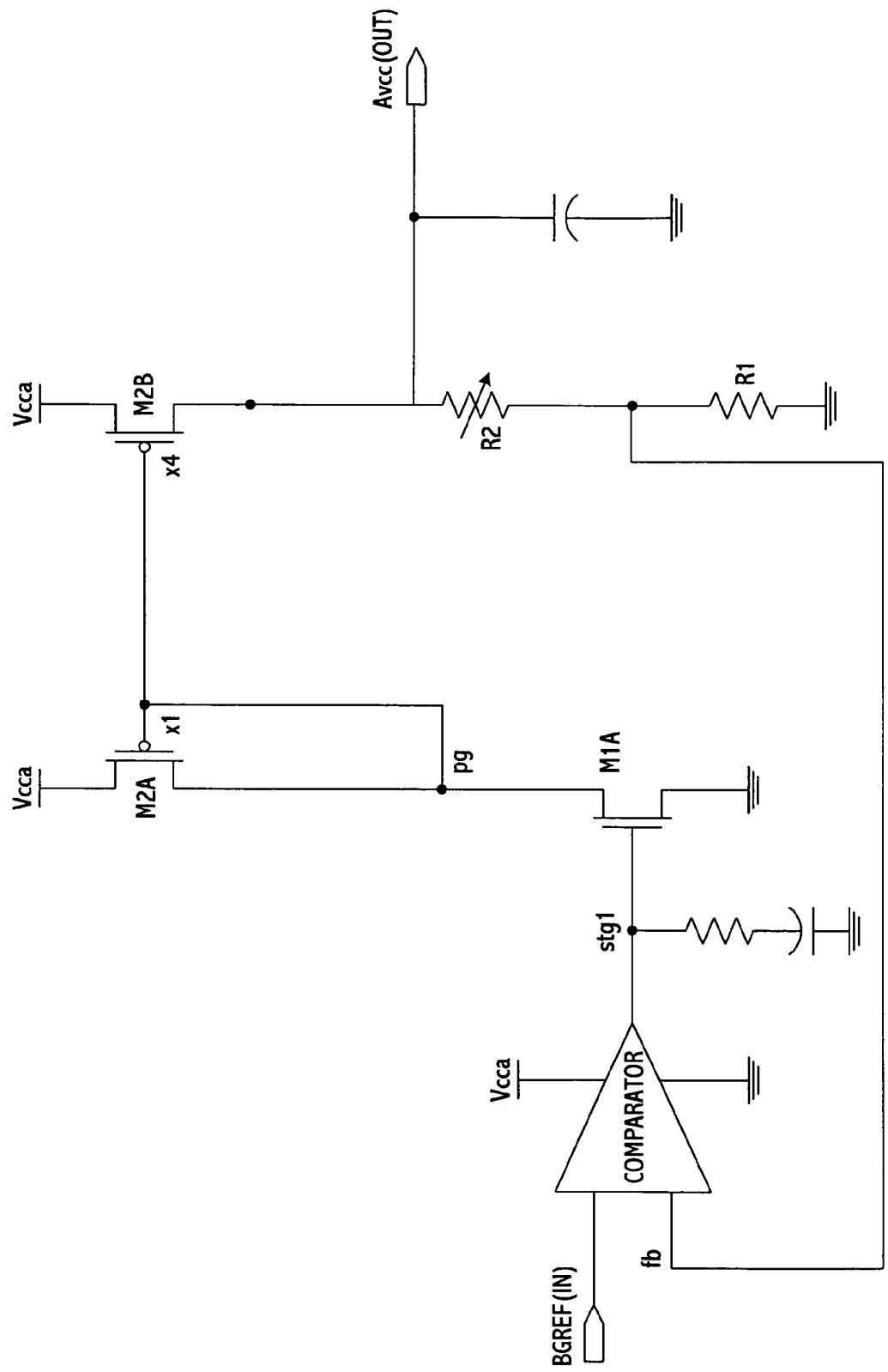
FIG. 5a shows a voltage regulator that may be used to generate a supply voltage.

FIG. 5a shows a voltage regulator which includes a comparator, a resistor-capacitor (RC) compensation network, a resistor divider formed from resistors R1 and R2, and an output stage including transistors M1A, M2A and M2B. The comparator insures that the two inputs FB and BGREF are equal. The resistor divider enables the output to be higher than the reference signal (BGREF) by a predetermined division ratio, (R1+R2)/R1. Resistor R2 can in fact be a set of series connected resistors. By shunting part of these resistors, the output level of the voltage regulator may be trimmed.

The transistor M2B may provide the current to the PLL. As transistors M2A and M2B form a current mirror, the current of M2B is a multiple of that of M2A, which may be a multiple of 10. The comparator may adjust the gate voltage of M1A, such that M1A may provide current to M2A and so that the multiple of this current in M2B will correspond to the load.

The RC compensation network at node STG1 may stabilize the voltage regulator. In order to achieve −25 dB of PSRR for the PLL, it may be necessary to decouple the current in the driver transistor, M2B, from changes in the source voltage, VCCA. Thus, both the gate-to-source voltage Vgs and drain-to-source voltage Vds of M2B should be regulated. Vgs is regulated by the transconductance (gm) of the current mirror transistor, M2A, while Vds is regulated by the bandwidth of the comparator. To obtain good PSRR at all frequencies, the comparator may have a high bandwidth. This stability condition dictates that the gain-bandwidth product is limited, so in order to achieve high bandwidth it may be necessary to have a low gain. The gain of the voltage regulator of FIG. 5a may be ~25 dB. This may result in a rather large systematic offset voltage, e.g., ~75 mV. (Note that systematic offset is the variation with process, voltage and temperature, and does not include device mismatch.)

Figure 5B:
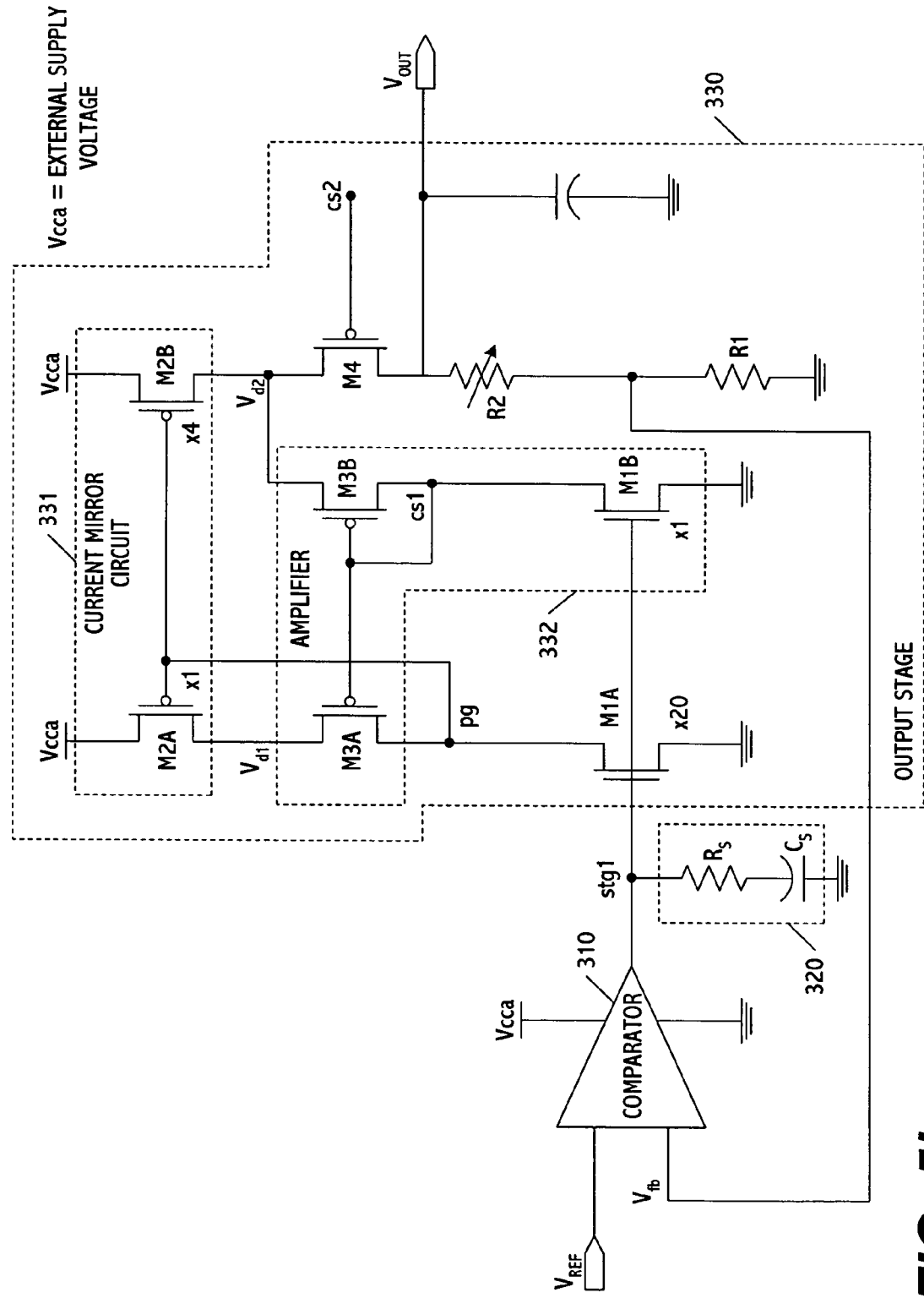
FIG. 5b shows another voltage regulator that may be used to generate supply voltages along one or more of the independent signal paths in FIGS. 2 and 4.

FIG. 5b shows another voltage regulator that may be used to generate each of the independent supply voltages Vcp and Vvco in FIGS. 2 and 4. Similar to FIG. 5a, the voltage regulator may include a comparator 310, a resistor divider formed from resistors $R_1$ and $R_2$, a compensation network 320, and output stage 330 for outputting the supply voltage $V_{out}$. If the voltage regulator is included along the path for generating the supply voltage for the charge pump, then $V_{out}=V_{cp}$. And, if the voltage regulator is included along the path for generating the supply voltage for the voltage-controlled oscillator, then $V_{out}=V_{vco}$.

The output stage includes a current mirror circuit 331 and an amplifier 332. The current mirror circuit is formed from input transistor M2A and output transistor M2B, where the gain-to-source voltage Vgs of M2B may be regulated by the transconductance (gm) of M2A. The amplifier 332 is formed from M3A, M3B and M1B and a cascode transistor M4 is also included. These additional transistors allow the voltage regulator of FIG. 5b to achieve improved performance over the voltage regulator of FIG. 5a for at least some applications.

In operation, the gate of M4 may be biased by a diode-connected transistor. The function of the cascode transistor and amplifier may be to regulate the drain-to-source voltage, $V_{d1}$, of transistor M2B and the drain-to-source voltage, $V_{d2}$, of its mirror M2A. Amplifier 332 may regulate $V_{d1}$ to be equal to $V_{d2}$ of transistor M2B. If the drain-to-source voltage and gate-to-source voltage of the current mirror input and output transistors are equal at all frequencies, then the current multiplication ratio is maintained. This may enable the current in the output stage to be substantially less sensitive to perturbations in the source voltage, which gives a good PSRR.

The drain-to-source regulation of the current mirror will now be described. Transistor M1B may have a divided version of the current in M1A, and the voltage at node CS1 may be defined by the following equations:

$$Vcs1 = Vd2 Vgs(M3B) \quad (1)$$

$$\text{where } Vgs(M3B) = Vt + Vdsat(M3B). \quad (2)$$

In Equations (1) and (2), Vcs1 is the voltage at node CS1, Vd2 is the drain voltage of M2B, Vgs corresponds to the gate-to-source voltage of transistor M3B, Vt is the threshold voltage of M3B, and Vdsat is the saturation drain voltage of M3B.

Drain voltage Vd1 may be defined as:

$$Vd1 = Vcs1 + Vgs(M3A) \tag{3}$$

$$\text{where } Vgs(M3A) = Vt + Vdsat(M3A) \tag{4}$$

In Equations (3) and (4), Vcs1 is the voltage at node CS1, Vd1 is the drain voltage of M2A, Vgs corresponds to the gate-to-source voltage of transistor M3A, Vt is the threshold voltage of M3A, and Vdsat is the saturation drain voltage of M3A.

The threshold and saturation voltages, Vt and Vdsat, of M3A and M3B may be designed to be equal or approximately equal to each other so that combining Equations (1)-(4) the following equality may be achieved:

$$Vd1 = Vd2 \tag{5}$$

Equation (5) may be valid even when cascode transistor M4 is in the linear region of operation, and the circuit may still function when M4 and M2B are in the linear mode. The amplifier formed by M3B, M3A and M1B may use drain voltage Vd2 as a reference and may set Vd1 equal to it. Thus, amplifier 332 may be operated to set the Vds value of the current mirror input stage (M2A) according to the Vds value of the current mirror output stage (M2B).

The voltage regulator of FIG. 5b may provide good PSRR characteristics even under very low headroom conditions, since output transistors M4 and M2B may operate in the linear mode. Since the drain-to-source voltage, Vds, may be regulated by amplifier 332, the comparator 310 may have a low bandwidth. This may allow the gain of the comparator to be higher than that of the voltage regulator of FIG. 5a, which enables the voltage regulator of FIG. 5b to have a lower systematic offset. Thus, the voltage regulator of FIG. 5b may be more accurate and have a higher PSRR than the voltage regulator of FIG. 5a at least for some applications.

Figure 6A:
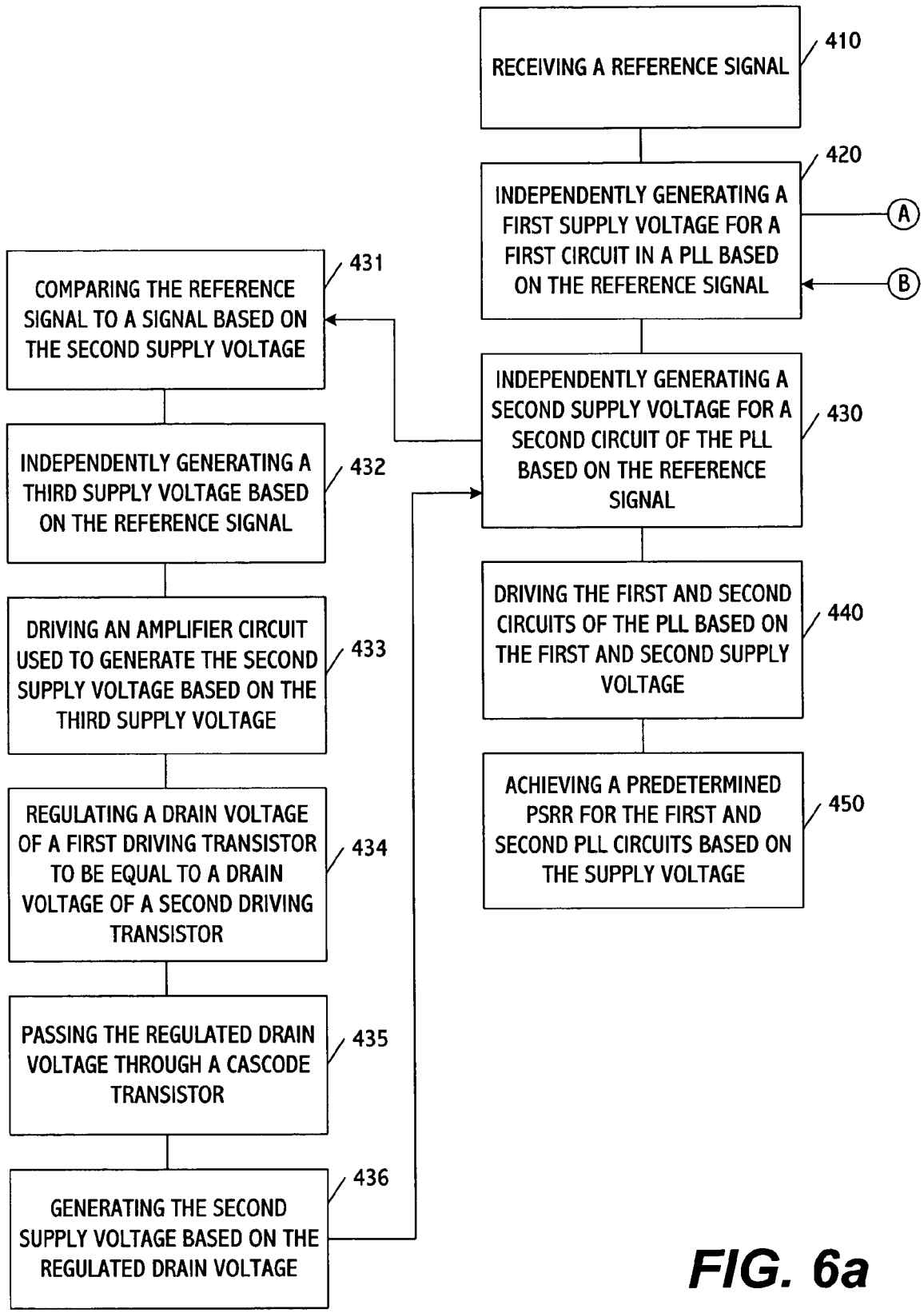
FIGS. 6a and 6b are diagrams showing operations that may be performed by one embodiment of a method for providing supply voltages to one or more elements of a phase-locked loop.
Figure 6B:
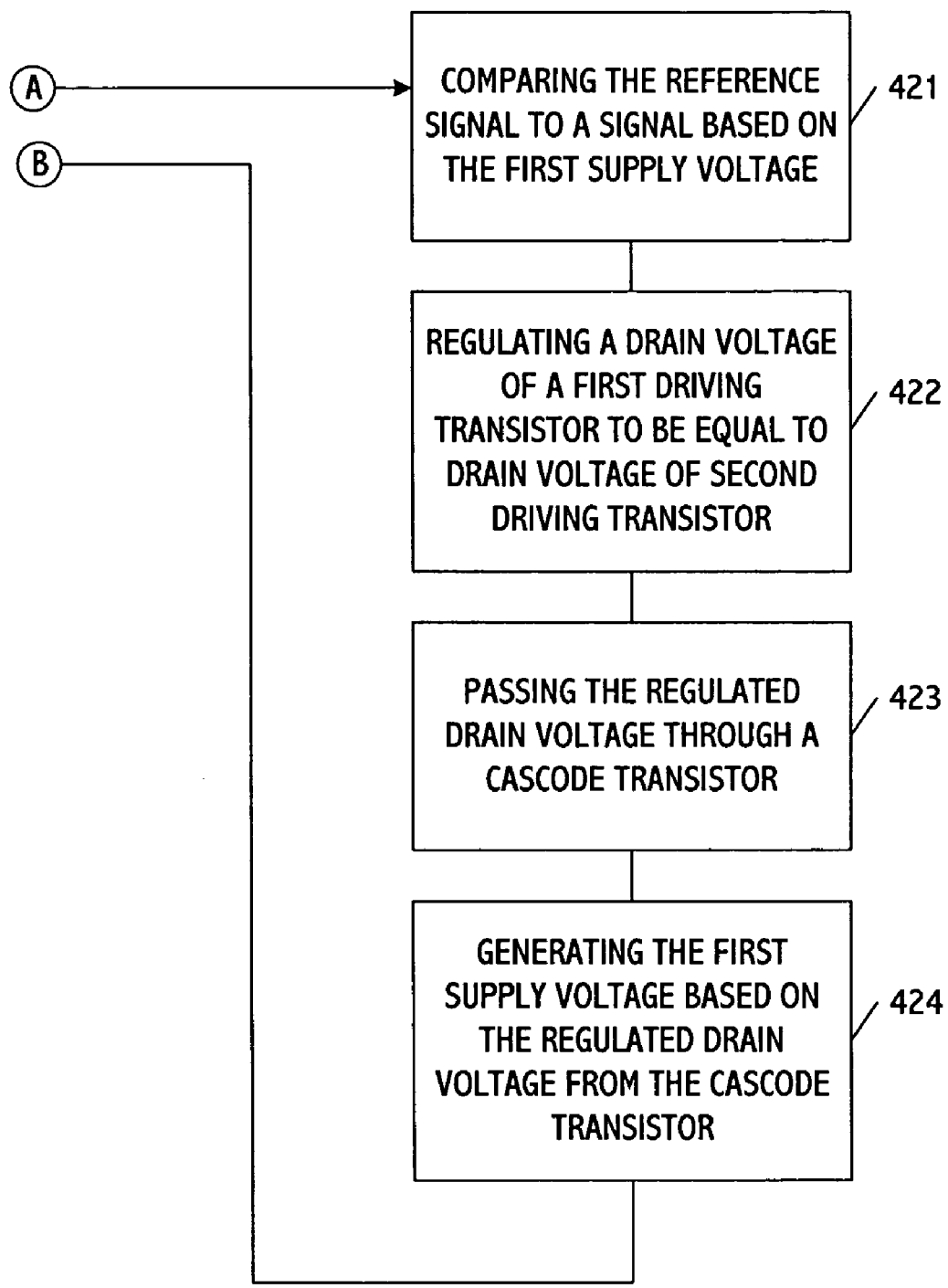

FIGS. 6a and 6b are diagrams showing operations that may be performed by one embodiment of a method for providing supply voltages to a phase-locked loop. The method may be performed using one or more of the aforementioned embodiments of the power supply circuit of the present invention or by a different circuit. Also, as previously indicated, the phase-locked loop may be the one shown in FIG. 1 or a different PLL may be used.

This method includes receiving a reference signal which, for example, may be a bandgap reference signal or another type of reference signal. (Block 410). The reference signal may optionally be passed through a loop filter prior to be received.

Once received, a first supply voltage is generated for a first circuit of a phase-locked loop (Block 420) and a second supply voltage is generated for a second circuit of the phase-locked loop (Block 430). The first and second supply voltages are independently generated based on the reference signal. The first and second supply voltages may be the same voltage or different voltages.

The first supply voltage may be generated by comparing the reference signal to a signal which is based on the first supply voltage, e.g., the signal $V_{fb}$ fed back from the voltage divider shown in FIG. 5. (Block 421). A drain voltage of a first driving transistor included in a first current mirror circuit is then regulated to at least substantially equal the drain voltage of a second driving transistor of this circuit. (Block 422).

These drain voltages may correspond, for example, to Vd1 and Vd2 in FIG. 5 and the regulation may be performed, in part, by the internal amplifier circuit. The regulated drain voltage is then passed through a cascode transistor (e.g., M4) coupled to the first current mirror circuit. (Block 423). The first supply voltage is then generated based on the regulated voltage passed through the cascode transistor. (Block 424).

The second supply voltage may be generated by comparing the reference signal to a signal which is based on the second supply voltage. (Block 431). A third supply voltage (e.g., $V_{ps}$ in FIG. 4) may then be generated based on the reference signal. The third supply voltage is generated independently from the first and second supply voltages. (Block 432). During this time, an amplifier circuit used to generate the second supply voltage may then be driven based on the third supply voltage. (Block 433).

A drain voltage of a first driving transistor included in a first current mirror circuit is then regulated to at least substantially equal the drain voltage of a second driving transistor of this circuit. (Block 434). These drain voltages may correspond, for example, to Vd1 and Vd2 in FIG. 5 and the regulation may be performed, in part, by the internal amplifier circuit. The regulated drain voltage is then passed through a cascode transistor (e.g., M4) coupled to the first current mirror circuit. (Block 435). The first supply voltage is then generated based on the regulated voltage passed through the cascode transistor. (Block 436).

Once generated, the first and second supply voltages are used to respectively drive the first and second circuits in the phase-locked loop. The first and second circuits may be the charge pump and voltage-controlled oscillator of the PLL or other circuit elements. (Block 440). Because the first and second supply voltages were independently generated, the charge pump and VCO may achieve predetermined PSRR values that may improve the performance of the PLL and its host circuit. (Block 450).

Figure 7:
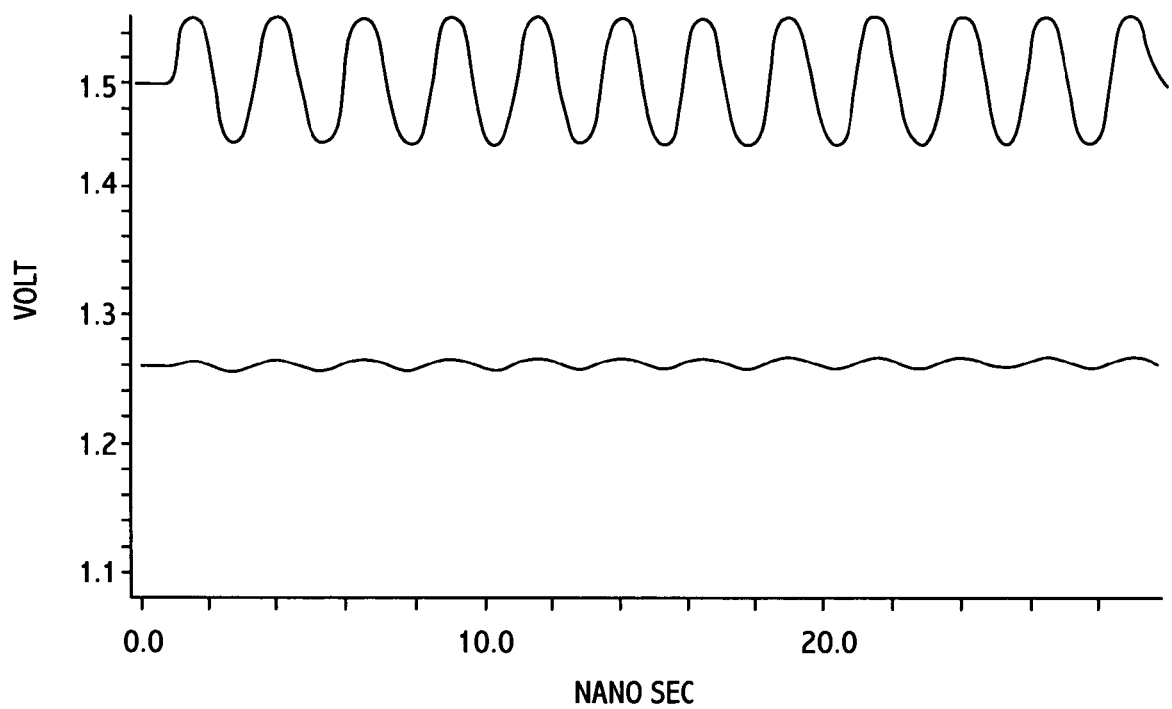
FIG. 7 is a graph showing a transient simulation of PSRR values obtained for the voltage regulator shown in FIG. 5.

FIG. 7 is a graph showing a transient simulation of PSRR values obtained for the voltage regulator shown in FIG. 5b. The VR was configured as shown in FIG. 4, with two series-connected operational amplifiers providing the supply voltage $V_{vco}$. The resulting waveforms correspond to an external VCCA of 1.5 V, an upper supply voltage ($V_{ps}$) of 1.3 V and a VCO supply voltage ($V_{vco}$) of 1.1 V. A sinus wave was imposed on the external VCCA supply at the word case PSRR frequency (i.e., 500 MHz), where the AC simulation showed a PSRR value of −48 dB. The VCO ripple was 0.35 mV (pp) for a 100 mV VCCA sinus.

Figure 8:
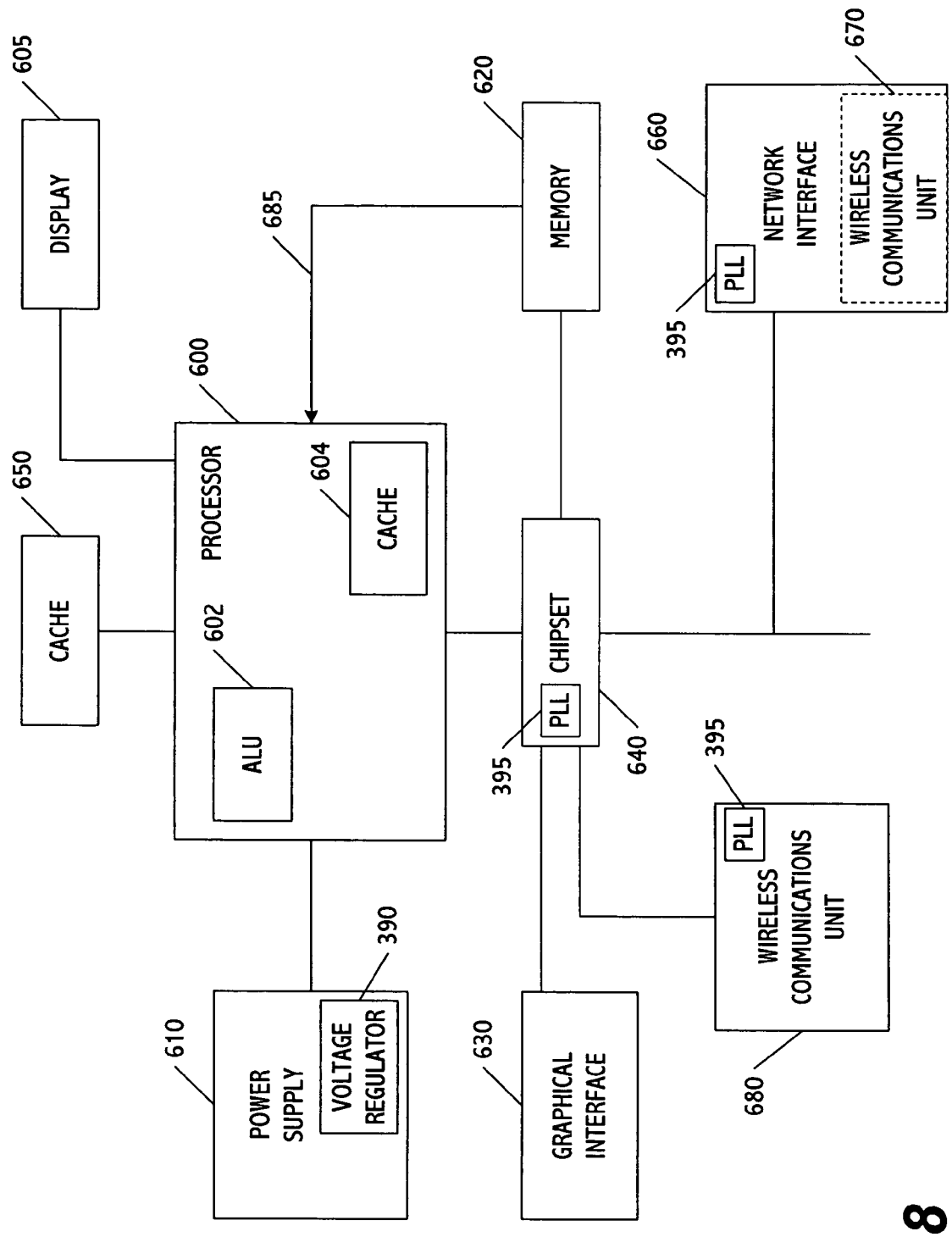
FIG. 8 is a diagram showing a system that may include a power supply circuit in accordance with any of the aforementioned embodiments of the present invention.

FIG. 8 shows a system which includes a processor 600, a power supply 610, and a memory 620 which, for example, may be a random-access memory. The processor includes an arithmetic logic unit 602 and an internal cache 604. The system also preferably includes a graphical interface 630, a chipset 640, a cache 650, a network interface 660, and a wireless communications unit 670, which may be incorporated within the network interface. Alternatively, or additionally, a communications unit 680 may be coupled to the processor, and a direct connection may exist between memory 620 and the processor as well.

A voltage regulator 390 in accordance with any of the embodiments of the present invention may be used to provide one or more supply voltages to a phase-locked loop circuit 395 included in the system. The voltage regulator may be included, for example, in power supply 610 and the phase-locked loop may be included in one or more of the processor, chipset, network interface or the wireless communications units.

The processor may be a microprocessor or any other type of processor, and may be included on a chip die with all or any combination of the remaining features, or one or more of the remaining features may be electrically coupled to the microprocessor die through known connections and interfaces. Also, the connections that are shown are merely illustrative, as other connections between or among the elements depicted may exist depending, for example, on chip platform, functionality, or application requirements.

As shown in FIG. 8, the voltage regulator may be included on the chip package with all or a portion of the other shown elements. The voltage regulator may be embodied within the package in different ways depending, for example, on the cost or performance requirements of the chip.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

I claim:

1. A power supply circuit, comprising: a node to receive at least one reference signal; a first voltage regulator to generate a first supply voltage for a first circuit of a phase-locked loop; a second voltage regulator to generate a second supply voltage for a second circuit of the phase-locked loop; and a third voltage regulator to generate a third power supply voltage independently from the first and second supply voltages based on the reference signal, the third supply voltage serving as a supply voltage for driving the second voltage regulator to generate the second supply voltage, wherein the first and second supply voltages are to be independently generated by the first and second voltage regulators based on the at least one reference signal and wherein the first and second supply voltages are to be generated so that a drop in the first supply voltage caused by operation of the first circuit of the phase-locked loop does not substantially change the second supply voltage generated for the second circuit of the phase-locked loop.

2. The power supply circuit of claim 1, wherein the first supply voltage and the second supply voltage correspond to a same voltage.

3. The power supply circuit of claim 1, wherein the first supply voltage and the second supply voltage are different voltages.

4. The power supply circuit of claim 1, wherein the first voltage regulator and the second voltage regulator are coupled to the same reference voltage.

5. The power supply circuit of claim 1, wherein the first voltage regulator and the second voltage regulator share a common supply voltage.

6. The power supply circuit of claim 1, wherein the first voltage regulator includes a first amplifier circuit and the second voltage regulator includes a second amplifier circuit, the first amplifier circuit to generate the first supply voltage based on a comparison of the reference signal and a signal based on the first supply voltage provided to the first amplifier circuit along a first feedback path, and
the second amplifier circuit to generate the second supply voltage based on a comparison of the reference signal and a signal based on the second supply voltage provided to the second amplifier circuit along a second feedback path.

7. The power supply circuit of claim 1, wherein the first supply voltage is to be generated with a first predetermined power supply rejection ratio and the second supply voltage is to be generated with a second predetermined power supply rejection ratio, and wherein the first predetermined power supply rejection ratio is different from the second predetermined power supply rejection ratio.

8. The circuit of claim 1, further comprising: a current mirror coupled to at least one of the first amplifier circuit or second amplifier circuit, the current mirror including an input transistor and an output transistor, wherein the output transistor of the current mirror drives current to an output of the voltage regulator and wherein drain-to-source voltages of the input and output transistors of the current mirror are regulated by a third amplifier circuit.

9. The circuit of claim 8, where the third amplifier circuit sets the drain-to-source voltage of the input transistor of the current mirror to be substantially equal to the drain-to-source voltage of the output transistor of the current mirror.

10. The circuit of claim 9, further comprising:
a cascode transistor having a first terminal coupled to an output of the current mirror and a second terminal coupled to the output of the voltage regulator.

11. The circuit of claim 10, wherein the input and output transistors of the current mirror and the cascode transistor are PMOS transistors.

12. The power supply circuit of claim 1, wherein the first circuit of the phase-locked loop is a charge pump and the second circuit of the phase locked loop is a voltage-controlled oscillator.

13. A method, comprising: receiving a reference signal; generating a first supply voltage for a first circuit of a phase-locked loop; and generating a second supply voltage for a second circuit of the phase-locked loop, the first and second supply voltages being independently generated based on the reference signal and so that a drop in the first supply voltage caused by operation of the first circuit of the phase-locked loop does not substantially change the second supply voltage generated for the second circuit of the phase-locked loop, wherein generating the first supply voltage includes: comparing the reference signal and the first supply voltage: and regulating a drain voltage of a first driving transistor included in a first current mirror circuit coupled between a comparator which is to perform said comparing and a node to output the first supply voltage, the drain voltage of the first driving transistor being regulated to be substantially equal to a drain voltage of a second driving transistor in the first current mirror circuit, the drain voltage of the first driving transistor coupled to the node which outputs the first supply voltage through a cascode transistor.

14. The method of claim 13, wherein the first supply voltage is generated with a first predetermined power supply rejection ratio and the second supply voltage is generated with a second predetermined power supply rejection ratio, and wherein the first predetermined power supply rejection ratio is different from the second predetermined power supply rejection ratio.

15. A method, comprising: receiving a reference signal: generating a first supply voltage for a first circuit of a phase-locked loop; and generating a second supply voltage for a second circuit of the phase-locked loop, the first and second supply voltages being independently generated based on the reference signal and so that a drop in the first supply voltage caused by operation of the first circuit of the phase-locked loop does not substantially change the second supply voltage generated for the second circuit of the phase-locked loop, generating a third power supply voltage independently from the first and second supply voltages based on the reference signal, the third supply voltage serving as a supply voltage for an amplifier circuit that is to generate the second supply voltage, wherein the first supply voltage is generated based on a comparison of the reference signal and a signal based on the first supply voltage, and wherein the second supply voltage is generated based on a comparison of the reference signal and a signal based on the second supply voltage.

16. The method of claim 13, wherein the first circuit of the phase-locked loop is a charge pump and the second circuit of the phase locked loop is a voltage-controlled oscillator.

17. A system, comprising: a phase-locked loop including first and second circuits; a first voltage regulator to generate a first supply voltage for the first circuit of the phase-locked loop; and a second voltage regulator to generate a second supply voltage for the second circuit of the phase-locked loop; and a third voltage regulator to generate a third power supply voltage independently from the first and second supply voltages based on the reference signal, the third supply voltage serving as a supply voltage for driving the second voltage regulator to generate the second supply voltage, wherein the first and second supply voltages are to be independently generated by the first and second voltage regulators based on the reference signal and wherein the first and second supply voltages are to be generated so that a drop in the first supply voltage caused by operation of the first circuit of the phase-locked loop does not substantially change the second supply voltage generated for the second circuit of the phase-locked loop.

18. The system of claim 17, wherein the first circuit of the phase-locked loop is a charge pump and the second circuit of the phase locked loop is a voltage-controlled oscillator.

19. The system of claim 17, wherein the first voltage regulator includes a first amplifier circuit and the second voltage regulator includes a second amplifier circuit, the first amplifier circuit to generate the first supply voltage based on a comparison of the reference signal and a signal based on the first supply voltage provided to the first amplifier circuit along a first feedback path, and the second amplifier circuit to generate the second supply voltage based on a comparison of the reference signal and a signal based on the second supply voltage provided to the second amplifier circuit along a second feedback path.

20. The system of claim 17, wherein the first supply voltage is to be generated with a first predetermined power supply rejection ratio and the second supply voltage is to be generated with a second predetermined power supply rejection ratio, and wherein the first predetermined power supply rejection ratio is different from the second predetermined power supply rejection ratio.

* * * * *